United States Patent
Suzuki

(10) Patent No.: US 6,476,452 B2
(45) Date of Patent: *Nov. 5, 2002

(54) BIPOLAR/BICMOS SEMICONDUCTOR DEVICE

(75) Inventor: Hisamitsu Suzuki, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/516,991

(22) Filed: Mar. 1, 2000

(65) Prior Publication Data

US 2002/0130370 A1 Sep. 19, 2002

(30) Foreign Application Priority Data

Mar. 1, 1999 (JP) ............................................. 11-052273

(51) Int. Cl.⁷ ......................... H01L 29/70; H01L 27/102
(52) U.S. Cl. ......................... 257/378; 257/370; 257/565
(58) Field of Search ................................. 257/273, 370, 257/378, 565

(56) References Cited

U.S. PATENT DOCUMENTS 5,059,546 A * 10/1991 Havemann ................. 257/378
5,525,530 A    6/1996 Watabe (List continued on next page.)

FOREIGN PATENT DOCUMENTS

| EP | 0 405 979 | 1/1991 | |
|----|-----------|--------|---|
| EP | 0 709 894 | 5/1996 | |
| EP | 0 709 894 A1 * | 5/1996 | ........... H01L/29/10 |
| JP | 59-112655 | 6/1984 | |
| JP | 61-248556 | 11/1986 | |
| JP | 63-284854 | 11/1988 | |
| JP | 01-208864 | 8/1989 | |
| JP | 03-165039 | 7/1991 | |
| JP | 06-021074 | 1/1994 | |
| JP | 06-151356 | 5/1994 | |
| JP | 07-153950 | 6/1995 | |
| JP | 08-022996 | 1/1996 | |
| JP | 10-125694 | 5/1998 | |

OTHER PUBLICATIONS

T. Igarashi, et al. "A Manufacturable 0.35 Mu M BICMOS Using Self–Aligned Cobalt Silicide Technology" ESSDERC 97. Proceedings of 27th European Solid–State Device Research Conference, Stuttgart, Germany, Sep. 22–24 1997, pp. 420–423 XP001058170, 1997, Paris, France, Editions Frontieres, ISBN: 2–86332–221–4.

S. Neil, et al. "A 54GHZ FMAX Implanted Base 0.35MUM Single–Poly Silicon Bipolar Technology". International Electron Devices Meeting 1997. IEDM Technical Digest. Washington, D.C., Dec. 7–10, 1997, New York, NY:IEEE US, pp. 807–810, XP000855916 ISBN: 0–7803–4101–5.

S. Niel; A 54GHz fmax implanted base 0.35 um single–polysilicon bipolar technology; 1997; pp. 807–810.

Primary Examiner—Allan R. Wilson

(57) ABSTRACT

An N type buried layer is buried in a P type silicon substrate. An N type epitaxial layer is formed on this buried layer. A P type intrinsic base region and an extrinsic base region are formed on the surface of the epitaxial layer. An N type emitter region is formed in the intrinsic base region. An emitter electrode is formed to contact the emitter region. A collector plug region is formed in an area separated from the extrinsic base region through a filed insulating film. A cobalt silicide film is formed on the extrinsic base region to surround the emitter electrode. An extrinsic base contact hole is formed at only one side of the emitter electrode. In the semiconductor device, the base resistance Rb and the collector-base capacity Ccb are reduced to make the maximum oscillation frequency fmax sufficiently large.

15 Claims, 17 Drawing Sheets

U.S. PATENT DOCUMENTS 5,543,653 A * 8/1996 Grubisich ................ 257/593
5,581,114 A    12/1996 Bashir et al.
5,744,854 A * 4/1998 Okada et al. ............ 257/565
6,027,962 A * 2/2000 Igarashi et al. .......... 438/202
6,028,345 A * 2/2000 Johnson ................ 257/592
6,030,864 A * 2/2000 Appel et al. ............ 438/234
6,232,638 B1 * 5/2001 Suzuki .................. 257/370
6,265,747 B1 * 7/2001 Suzuki .................. 257/370

* cited by examiner

SINGLE BASE STRUCTURE

DOUBLE BASE CONTACT STRUCTURE

BIPOLAR/BICMOS SEMICONDUCTOR DEVICE

BACKGROUND OF THE INVENTION

1. Field of the Invention

The present invention relates to a semiconductor device which is useful for the application to a BiCMOS transistor wherein a bipolar transistor and a CMOS transistor are intermixed, and a process for fabricating the same; and in particular to a semiconductor device wherein a bipolar transistor is improved, and a process for fabricating the same.

2. Description of the Prior Art

Recently, it has been demanded to improve the performance of an analogue/digital intermixing LSI (large scale integrated circuit), wherein an analogue circuit and a digital circuit are mounted inside a single chip, and reduce costs thereof with rapid popularization of a personal handy system (PHS), a portable telephone, a communication terminal for a network, and the like.

In general, a CMOS transistor, which can easily make its consumption electric power small, is used as a digital circuit corresponding to high-speed action in the analog/digital intermixing LSI. As an analogue circuit corresponding to high-speed action, a high-performance bipolar transistor is used, and the action of the circuit is performed at a high frequency of several hundreds of MHz to several tens of GHz. Therefore, in order to use the analogue circuit at higher frequencies, it is necessary to improve high frequency characteristics of the bipolar transistor.

As indexes of AC characteristics of the bipolar transistor, fT (cut-off frequency) and fmax (maximum oscillation frequency) are known. Especially, the maximum oscillation frequency fmax, which is an index of driving ability of the bipolar transistor, is a factor for estimating main characteristics of the bipolar transistor. This fmax is approximately represented by the following formula:

$$fmax \approx \sqrt{(fT/(8\pi \cdot Rb \cdot Ccb))}$$

wherein Rb represents a base resistance, and Ccb represents a capacity between collector and base (base-to-collector capacitance).

The expression representing the fmax includes fT, as is clearly from the formula 1. Therefore, the fmax shows the total performance of the high frequency characteristics of the bipolar transistor. It can be said that as this value is larger, the high frequency characteristics are better.

Incidentally, it can be understood from this formula 1 that in order to heighten the fmax, it is effective to improve the cut-off frequency fT, and reduce the base resistance Rb and the collector-base capacity.

The following will describe a conventional method for reducing the base resistance Rb and improving the fmax. The conventional technique for reducing the base resistance is described in pages 807 to 810 of 1997 IEDM (International Electron Device Meeting) Technical Digest.

FIG. 1 is a plan view showing an arrangement of respective layers of a conventional bipolar transistor. FIG. 2 is a sectional view taken along F—F line of FIG. 1. FIG. 3 is a sectional view taken along G—G line of FIG. 1. As shown in FIGS. 1–3, in the conventional bipolar transistor a high-concentration N type buried layer 503 is formed on a P type semiconductor substrate 501. Moreover, an N type epitaxial area 504 is formed to cover the buried layer 503. In the N type epitaxial area 504, a pedestal collector 512, which is an N type area having an impurity concentration that is in the middle of concentrations of the epitaxial area 504 and the buried layer 503, is formed just under a high-concentration N type diffusion layer 520, which is an emitter region. In this way, the collector area of the bipolar transistor is composed of the high-concentration N type buried layer 503, the N type epitaxial area 504 and pedestal collector 512.

An element separation oxide film 506 is formed in the surface of the N type epitaxial area 504. This element isolation oxide film 506 is formed to surround an intrinsic base region 509, a high-concentration P type diffusion layer 518, and a high-concentration N type diffusion layer 519. The intrinsic base region 509 and the high-concentration P type diffusion layer 518 are electrically isolated from the high-concentration N type diffusion area 519 by means of the element isolation oxide film 506. A high-concentration N type diffusion layer 520 is formed inside the intrinsic base region 509. This high-concentration N type diffusion layer 520 makes an emitter region. An emitter leading-out electrode 513 made of polysilicon is formed to connect this emitter region. A titanium silicide film 521 is formed on the surface of this emitter electrode 513. The titanium silicide film 521 is also formed on the surface of the high-concentration P type diffusion layer 518 to make an extrinsic base region (a graft base region). The surface of a collector plug region, which is composed of the high-concentration N type diffusion layer 519, is also covered with the titanium silicide film 521. An interlayer dielectric 522 is formed on its whole surface. In this interlayer dielectric 522, base contact holes 524 are made in its extrinsic base region, and a contact hole 525 for collector plug is made in the collector plug region. An emitter contact hole 526 is made in the interlayer dielectric 522 just above the emitter electrode.

The following will describe the form of a plan view arrangement of the above-mentioned conventional bipolar transistor. In this bipolar transistor, the high-concentration P type diffusion layer 518, the surface of which is covered with the titanium silicide film 521, is divided into right and left portions in FIG. 21 by means of the emitter leading-out electrode 513 composed of the second conductive film, the surface of which is covered with the titanium silicide film 521. The base contact holes 524 are made at right and left positions adjacent to the emitter leading-out electrode 513 composed of the second conductive film, so as to make a form of the arrangement for leading out a non-illustrated metal wiring for leading-out of the base electrode.

The plan view layout according to this method is as follows: the surface of the high-concentration P type diffusion layer 518 is covered with the titanium silicide film having a sheet resistance of about 5 Ω/square and the non-illustrated metal wiring for leading-out of the base electrode is led out at both ends of the emitter leading-out electrode 513 composed of the second conductive film. Therefore, this layout makes it possible to make the base resistance lower than the layout wherein the surface of the high-concentration P type diffusion layer 518 is not covered with any titanium silicide. The above-mentioned known publication states that for this reason the maximum oscillation frequency fmax can be raised up to 54 GHz when the voltage between the collector and the emitter (C–E voltage) is 2.5 V.

The following will describe an example of a process for fabricating the above-mentioned conventional bipolar transistor, referring to FIGS. 4–10.

As shown in FIG. 4, the high-concentration N type buried layer 503 is formed on the P type semiconductor substrate 501. The N type epitaxial area 504 of 1 μm in thickness is formed on the P type semiconductor substrate 501 to cover the high-concentration N type buried layer 503.

Next, as shown in FIG. 5, the element isolation oxide film 506 is formed on the epitaxial area 504 by the LOCOS (Local oxidation of Silicon) method. Furthermore, the first oxide film 505 is formed on the epitaxial area 504 to have a thickness of 12 nm.

Next, as shown in FIG. 6, the high-concentration N type diffusion layer 519 is formed, in the portion which becomes the collector plug region between the element isolation oxide films 506, inside the epitaxial area 504 by ion implantation of, for example, phosphorus. Furthermore, boron is ion-implanted into the epitaxial area 504 at an energy of 7 keV to form the intrinsic base region 509 in the epitaxial area 504.

Next, as shown in FIG. 7, a widow for forming an emitter region is made in the first oxide film 505. Phosphorus is then implanted into the epitaxial area 504 at an energy of 550 keV to form the pedestal collector 512 therein. Thereafter, the second conductive layer comprising polysilicon containing arsenic is grown on the whole surface to have a thickness of 250 nm. This is then patterned to form the emitter leading-out electrode 513 comprising the second conductive film on the opened window in the first oxide film 505.

Next, as shown in FIG. 8, a side wall 517 comprising an oxide film and having a thickness of 150 nm is formed on the side wall of the emitter leading-out electrode 513. Boron is ion-implanted therein at an energy of 10 keV to form the high-concentration P type diffusion layer 518, with self alignment, in the surface of the epitaxial area 504, using the emitter leading-out electrode 513 and the side wall 517 as masks. Subsequently, the resultant is subjected to RTA (Rapid Thermal Annealing) treatment, for example, at 1025° C. for 20 seconds to diffuse arsenic from the emitter leading-out electrode 513, which is the second conductive film containing arsenic, into the intrinsic base region 509. The high-concentration N type diffusion layer 520 is formed in the intrinsic base region 509.

Next, as shown in FIG. 9, a known silicide technique is used to form the titanium silicide film 521, with self alignment, on the surface of the emitter leading-out electrode 513, the high-concentration P type diffusion layer 518 and the high-concentration N type diffusion layer 519.

Next, as shown in FIG. 10, the interlayer dielectric 522 is formed on the whole surface. The contact holes 526, 524 and 525 are made, at the positions corresponding to the emitter leading-out electrode 513, the high-concentration P type diffusion layer 518 and the high-concentration N type diffusion layer 519, in the interlayer dielectric 522. Thereafter, a contact plug 527 comprising a barrier metal composed of W and, for example, Ti/TiN is buried in the contact holes to form a pattern of a metal wiring 528 on the interlayer dielectric 522.

However, in the above-mentioned conventional bipolar transistor, the extrinsic base region composed of the high-concentration P type diffusion layer 518 and the titanium silicide film 521 is formed at both sides of the emitter electrode 513, and the base contact hole 524 for leading out base electrical potential is made in each of the extrinsic base regions. Therefore, the extrinsic base region, and the metal wirings 528 for leading out base electrical potential are present at both sides of the emitter electrode 513 so that the collector-base capacity Ccb cannot be made small. On the other hand, if the extrinsic base region (high-concentration P type diffusion layer 518) and the base contact hole 524 are disposed at only one side of the emitter electrode 513 to make the collector-base capacity Ccb small, the base resistance Rb increases. It is evident from the formula (1) that when the capacity Ccb or Rb increases in this way, the maximum oscillation frequency fmax drops to deteriorate the characteristics as a bipolar transistor. Accordingly, the conventional bipolar transistors have a problem that a sufficiently large maximum oscillation frequency cannot be obtained.

SUMMARY OF THE INVENTION

Thus, an object of the present invention is to provide a semiconductor device making it possible to reduce the base resistance Rb and the collector-base capacity Ccb to make the maximum oscillation frequency fmax sufficiently large and improve transistor characteristics, and a process for fabricating the same.

A first semiconductor device of the present invention comprises a first conduction type semiconductor substrate, a second conduction type area formed on a surface of the semiconductor substrate, a first conduction type intrinsic base region formed on a surface of the second conduction type area, an extrinsic base region surrounding the intrinsic base region, a second conduction type emitter region formed in the intrinsic base region, an emitter electrode contacting the emitter region, a second conduction type collector plug region formed in the second conduction type area, an element isolation area for isolating the first conduction type intrinsic base region and the extrinsic base region electrically from the second conduction type collector plug region, and a cobalt silicide film formed to surround the emitter electrode, as viewed from above, on the extrinsic base region.

A second semiconductor device of the present invention comprises a first conduction type semiconductor substrate, a second conduction type buried layer formed in the semiconductor substrate, a second conduction type epitaxial layer formed on the buried layer, a first conduction intrinsic base region formed on a surface of the epitaxial layer, an extrinsic base region surrounding the intrinsic base region, a second conduction type emitter region formed in the intrinsic base region, an emitter electrode contacting the emitter region, a second conduction type collector plug region formed on the buried layer, an element isolation area for isolating the intrinsic base region and the extrinsic base region electrically from the collector plug region, and a cobalt silicide formed to surround the emitter electrode, as viewed from above, on the extrinsic base region.

A third semiconductor device of the present invention comprises a first conduction type semiconductor substrate, second conduction type first and second well areas formed on a surface of the semiconductor substrate, a first conduction type third well area formed on the surface of the semiconductor substrate between the first and second well areas, a second conduction type MOS transistor formed in the first well area, a first conduction type MOS transistor formed on the third well area and a bipolar transistor formed in the second well area. Said bipolar transistor comprises a first conduction type intrinsic base region formed on the surface of the second well area, an extrinsic base region surrounding the intrinsic base region, a second conduction type emitter region formed in the intrinsic base region, an emitter electrode contacting the emitter region, a second conduction type collector plug region formed in the second conduction type area, an element isolation area for isolating the first conduction type intrinsic base region and the extrinsic base region electrically from the second conduction type collector plug region, and a cobalt silicide film formed to surround the emitter electrode, as viewed from above, on the extrinsic base region.

In these semiconductor devices, one base contact connected with the extrinsic base region is preferably arranged for the single emitter electrode.

A fourth semiconductor device of the present invention comprises a first conduction type semiconductor substrate, a second conduction type area formed on a surface of the semiconductor substrate, a pair of first conduction type intrinsic base regions formed on a surface of the second conduction type area, a first conduction type extrinsic base region formed to surround the intrinsic base regions as viewed from above, a second conduction type emitter region formed in the respective intrinsic base regions, a pair of emitter electrodes contacting the emitter region, a collector plug region formed in the second conduction type area, an element isolation area for isolating the extrinsic base region electrically from the collector plug region, and a cobalt silicide film formed to surround the respective emitter electrodes, as viewed from above, on the extrinsic base region.

This semiconductor device may comprise a pair of base contacts arranged in the extrinsic base region at both outsides of the emitter electrode and connected with the extrinsic base region, or a base contact area arranged in the extrinsic base region between the pair of the emitter electrodes and connected with the extrinsic base region.

A process for fabricating a semiconductor device of the present invention comprises the steps of forming an element isolation area for dividing a base formation planning area from a collector formation planning area, and a second conduction type area including these planning areas on a first conduction type silicon substrate; forming a first conduction type intrinsic base region on a surface of the second conduction type area of the base formation planning area; forming an insulating film on the whole surface thereof and making an opening in the emitter formation planning area of the insulating film; forming an emitter electrode comprising polysilicon film containing a second conduction type impurity on the insulating film to fill up in the opening of the insulating film; forming an emitter region contacting said emitter electrode in the intrinsic base region, forming an extrinsic base region surrounding the intrinsic base region in the intrinsic base region not converted with the emitter electrode, and forming a collector plug region in the collector formation planning area; forming a cobalt film on the whole surface and then reacting the cobalt film with the silicon of the substrate to form a cobalt silicide film; removing any unreacted cobalt film; forming an interlayer dielectric on the whole surface and then making contact holes at positions aligning with the cobalt silicide film in the emitter electrode and the extrinsic base region, and the cobalt silicide film in the collector leading-put area; and burying a conductive material in the contact holes to form contacts.

In the present invention, the cobalt silicide film is formed on the extrinsic base region to surround the periphery of the emitter electrode, and the contact contacting this cobalt silicide film is arranged at only one side of the emitter electrode. Any conventional titanium silicide film has a narrow line effect. Thus, if its width is made small, its layer resistance increase. Conventionally, wirings for leading out base voltage are arranged at both sides of the emitter electrode to lower the base resistance as much as possible. Therefore, in conventional bipolar transistors, the width of the titanium silicide film 521 on the high-concentration P type diffusion layer 518 cannot be made narrow. This is a reason why the distance between the emitter electrode 513 and the field insulating film 506 cannot be made small and the collector-base capacity Ccb cannot be reduced.

On the other hand, in the present invention, the cobalt silicide film is used instead of the titanium silicide and further the cobalt silicide film is formed in a ring form so as to surround the emitter electrode. The resistance when an electric current is passed from the intrinsic base region to the cobalt silicide film through the extrinsic base region, that is, the resistance when an electric current is passed in a vertical direction, is larger than the corresponding resistance in the case of using the titanium silicide. Therefore, even if the contact is disposed at only one side of the emitter electrode as in the present embodiment, the base resistance Rb can be made sufficiently small. Since the contact and the wiring connecting with it are formed at only one side of the emitter electrode, the distance between the emitter electrode and the filed insulating film, that is, the width of the base region, can be made small so that the collector-base capacity Ccb can be made small. According to the present invention, therefore, the maximum oscillation frequency fmax can be improved to improve transistor characteristics.

DESCRIPTION OF PREFERRED EMBODIMENTS

Embodiments of the present invention will be described hereinafter, referring to the attached drawings.

Figure 11:
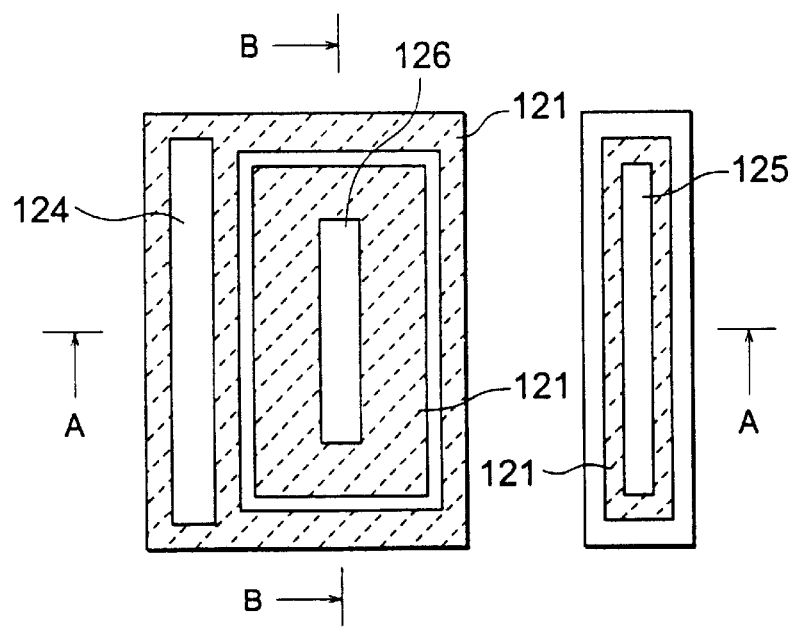
FIG. 11 is a plan view showing an arrangement of a bipolar transistor according to a first embodiment of the present invention.
Figure 12:
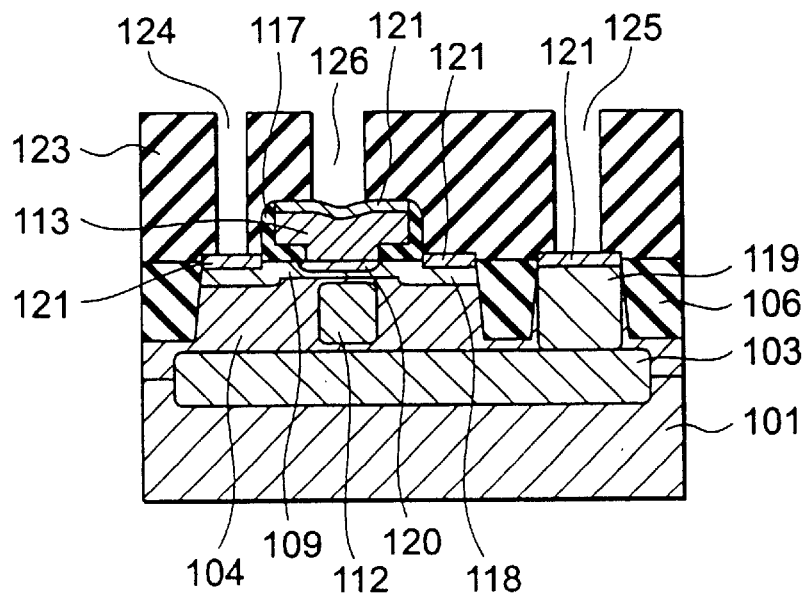
FIG. 12 is a sectional view taken along A—A line of FIG. 11.
Figure 13:
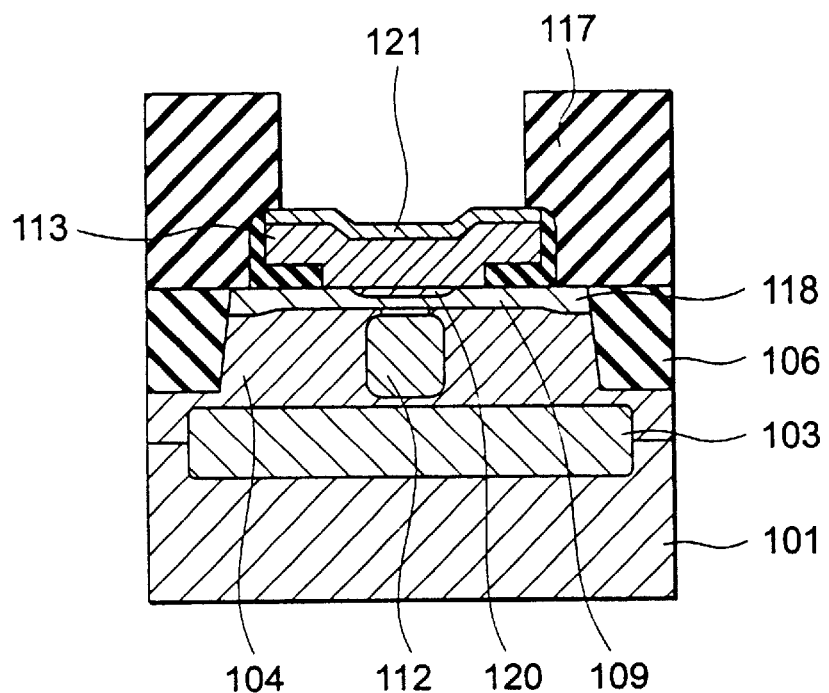
FIG. 13 is a sectional view taken along B—B line of FIG. 11.
Figure 14:
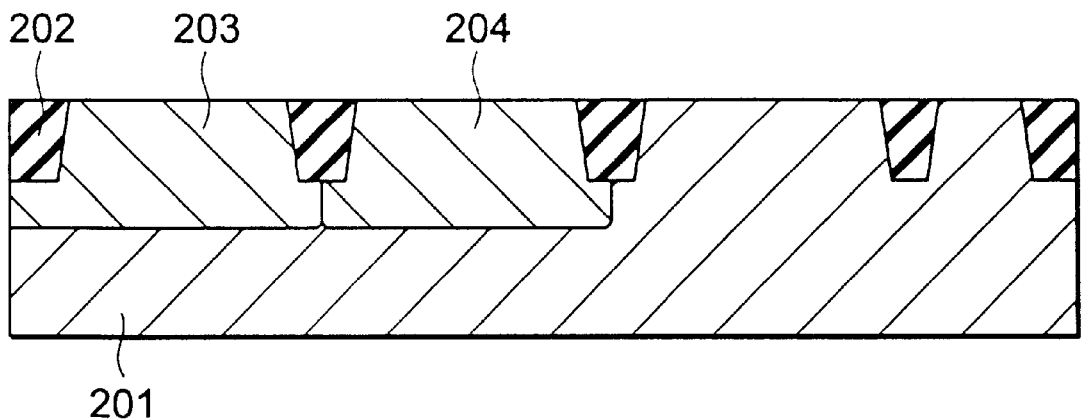
FIG. 14 is a sectional view showing a step of fabricating a BiCMOS transistor according to a second embodiment of the present invention.

FIG. 11 is a plan view showing an arrangement of respective layers of a bipolar transistor according to a first embodiment of the present invention. FIG. 12 is a sectional view taken along A—A line of FIG. 11. FIG. 13 is a sectional view taken along B—B line of FIG. 11. In the bipolar transistor of the present embodiment, a high-concentration N type buried layer 103 is formed on a P type semiconductor substrate 101. An N type epitaxial area 104 is formed on the substrate 101 to cover the high-concentration N type buried layer. A pedestal collector 112, which is an N⁻ type area having an impurity concentration that is in the middle of concentrations of the N type epitaxial area 104 and the high-concentration N type buried layer 103, is formed just under a high-concentration N type diffusion layer 120, which is an emitter region in the N type epitaxial area 104. The high-concentration N type buried layer 103, the N type epitaxial area 104 and the pedestal collector 112 makes the collector area of the bipolar transistor. A high-concentration P type diffusion layer 118 is formed in the surface of the substrate to surround an intrinsic base region 109. This high-concentration P type diffusion layer makes an extrinsic base region. Moreover, an element isolation oxide film 106 is formed on the surface of the N type epitaxial area 104.

This element isolation oxide film 106 is formed to surround the intrinsic base region 190, the high-concentration P type diffusion layer 118 (extrinsic base region), and the high-concentration N type diffusion layer 119 (collector plug region). The intrinsic base region 109 and the high-concentration P type diffusion layer 118 are electrically isolated from the collector plug region composed of the high-concentration N type diffusion area 119 by means of the element isolation oxide film 106.

A high-concentration N type diffusion layer 120 is formed inside the intrinsic base region 109. This high-concentration N type diffusion layer 120 makes an emitter region. An emitter leading-out electrode 113 made of a second conductive film is formed to connect with this high-concentration N type diffusion layer 120. A cobalt silicide film 121 is formed on the upper surface of this emitter leading-out electrode 113. A side wall 117 is formed on the side surface thereof. Moreover, a high-concentration P type diffusion layer 118 is formed, with self-alignment, on the side wall 117. The cobalt silicide 121 is also formed on the surface of the high-concentration P type diffusion layer 118. This high-concentration P type diffusion layer 118 and the cobalt silicide film 121 make an extrinsic base region. Besides, the surface of the collector plug region comprising the high-concentration N type diffusion layer 119 is covered with the cobalt silicide film 121.

An interlayer dielectric 123 is formed on its whole surface. In this interlayer dielectric 123, a base contact hole 124 is made above the high-concentration P type diffusion layer 118 of an opposite side to the collector plug electrode in relative to the emitter leading-out electrode 113, so as to make it possible to lead out a non-illustrated metal wiring for leading out the base electrode. A contact hole 125 for collector plug is made in the interlayer dielectric 123 above the collector plug region comprising the high-concentration N type diffusion layer 119. A contact hole 126 for emitter leading-out is made above the emitter leading-out electrode 113 whose surface is covered with the cobalt silicide film 121.

The following will describe action of the bipolar transistor of the present embodiment having the above-mentioned structure. As shown in FIG. 11, in the bipolar transistor of the present embodiment, the high-concentration P type diffusion layer 118 (extrinsic base region) whose surface is covered with cobalt silicide film 121 is formed in a ring form to surround the periphery of the emitter leading-out electrode 113 comprising the second conductive film.

By this, the contact hole 124 for leading-out the base electrode and the non-illustrated metal wiring can be arranged at only one side of the emitter leading-out electrode 113 in the present embodiment so that the base contact can be led out from only one side of the emitter electrode. In this way, the size of the bipolar transistor can be made small according to the present invention.

In the present embodiment, the cobalt silicide film is used instead of any conventional titanium silicide film. The resistance when an electric current is passed from the intrinsic base region 109 to the cobalt silicide film 121 through the extrinsic base region 118, that is, the resistance when an electric current is passed in a vertical direction, is larger than the corresponding resistance in the case of using the titanium silicide. Therefore, even if the base contact (contact hole 124) is disposed at only one side of the emitter electrode 113 as in the present embodiment, the base resistance Rb can be made sufficiently small. Since the contact and the wiring for connecting it are formed at only one side of the emitter electrode, the distance between the emitter electrode and the filed insulating film, that is, the width of the base region, can be made small so that the collector-base capacity Ccb can be made small. According to the present invention, therefore, the maximum oscillation frequency fmax can be improved to improve transistor characteristics.

The above-mentioned embodiment is an embodiment wherein the present invention is applied to a bipolar transistor, but the effect of the present invention is made still more remarkable by applying the present invention to a BiCMOS wherein a bipolar transistor and a CMOS transistor are made in the same single chip.

Figure 18:
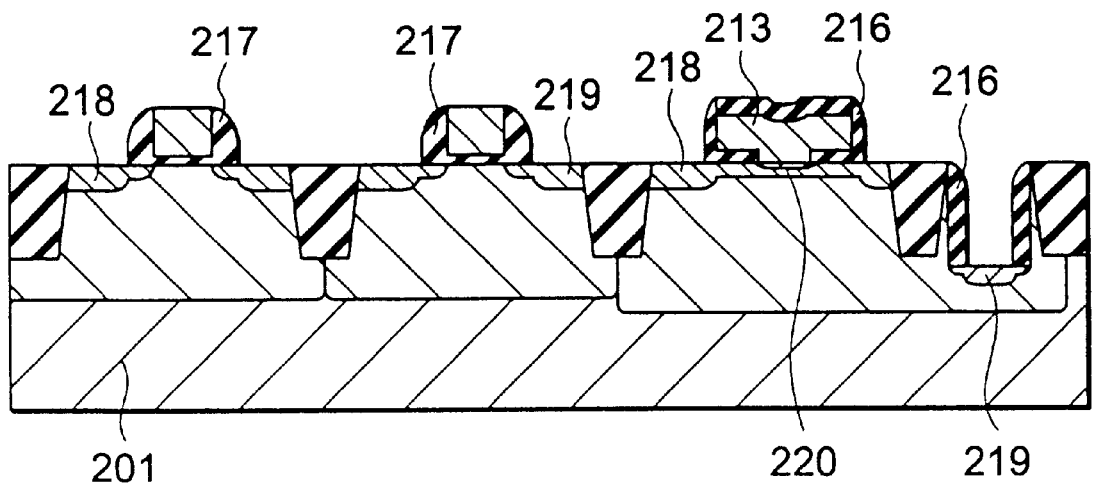
FIG. 18 is a sectional view showing a step next to the step shown in FIG. 17.
Figure 19:
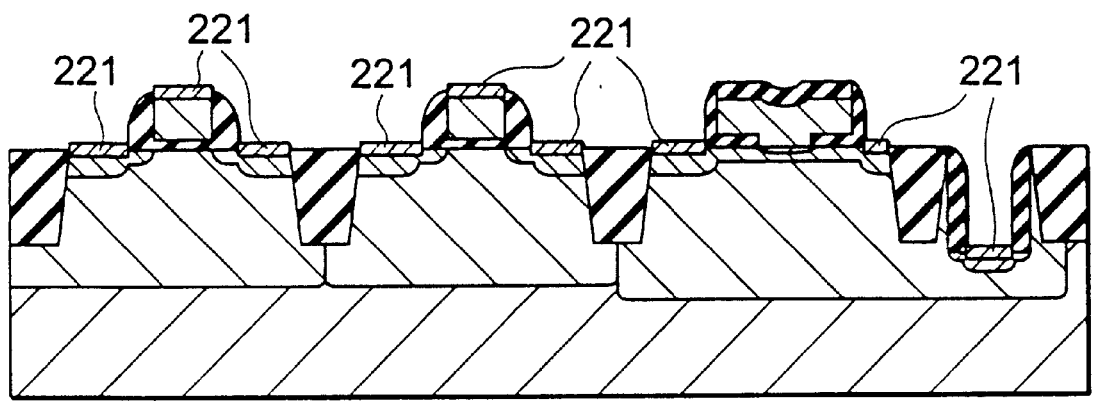
FIG. 19 is a sectional view showing a step next to the step shown in FIG. 18.
Figure 20:
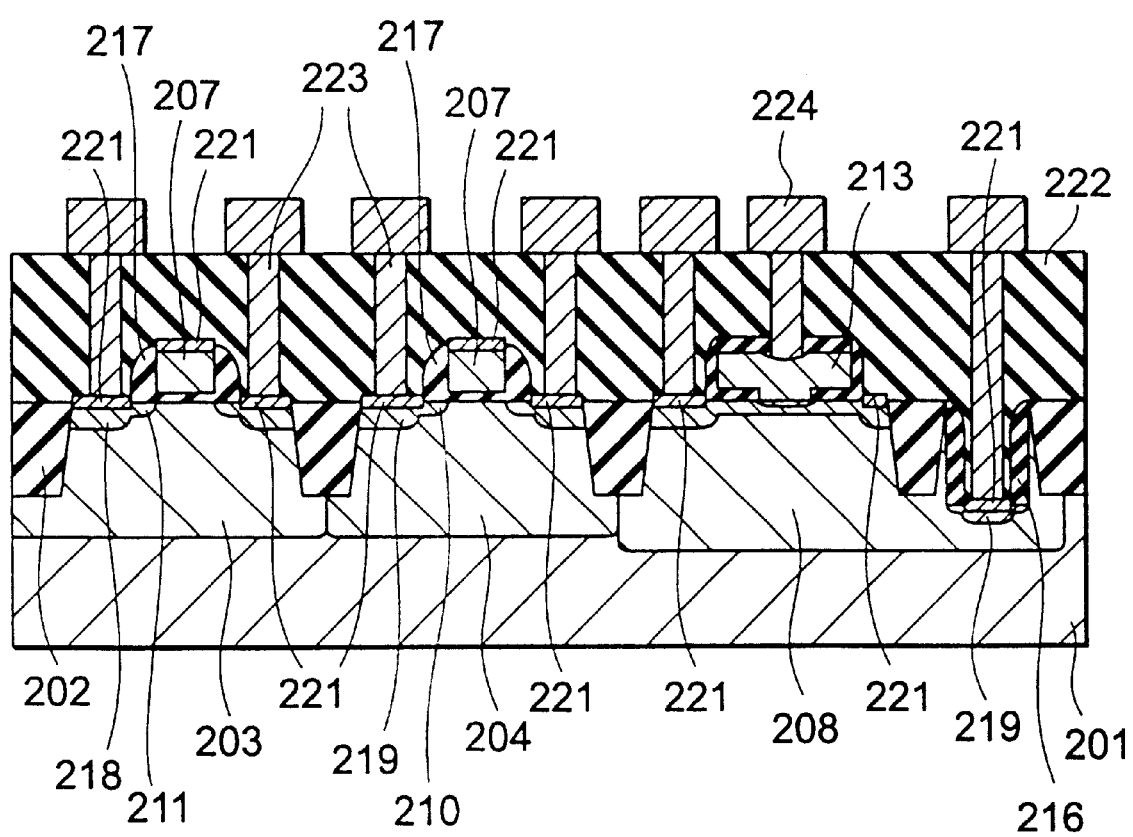
FIG. 20 is a sectional view showing a BiCMOS transistor according to a second embodiment.

FIGS. 14–20 are sectional views showing a second embodiment of the present invention wherein the present invention is applied to a BiCMOS. FIGS. 14–20 are sectional views showing a process for fabricating the BiCMOS in the order of its steps. Referring to FIG. 20, the sectional structure of the BiCMOS of the present second embodiment will be first described.

A P type well area 204 and a first N type well area 203 for constituting a CMOS, and a second N type well area 208 for constituting a bipolar transistor are formed on a P type semiconductor substrate 201. Inside the P type well area 204, a gate electrode 207 whose upper surface is covered with a cobalt silicide film 221, and a side wall 217 on the side thereof are formed. A high-concentration N type diffusion layer 219 is formed beneath the side wall 217 to self-align with the N type diffusion layer 210 and the side wall 217. A cobalt silicide film 221 is formed on the surface of the area 219. The N type diffusion layer 210 and the high-concentration N type diffusion layer 219 constitute the LDD source/drain area of an NMOS.

Inside the first N type well area 203, a gate electrode 207 whose upper surface is covered with a cobalt silicide film 221, and a side wall 217 on the side thereof is formed. A high-concentration P type diffusion layer 218 is formed beneath the side wall 217 to self-align with the P type diffusion layer 211 and the side wall 217. A cobalt silicide film 221 is formed on the surface of the area 218. The P type diffusion layer 211 and the high-concentration P type diffusion layer 218 constitute the LDD source/drain area of a PMOS.

Inside the second N type well area 208 making the collector area of the bipolar transistor, an element isolation oxide film 202 is present to isolate a collector plug portion from an emitter/base forming area. A trench collector 215 is formed in the collector plug portion. A side wall composed of a second LDD oxide film 216 is formed on the side wall of the trench collector 215. A high-concentration N type diffusion layer 219 is formed at the bottom of the trench collector 215 to self-align with the side wall composed of the second LDD oxide film 216. A cobalt silicide film 221 is formed on the surface of the area 219. In the emitter/base forming area, an emitter leading-out electrode composed of the second conductive film 213 is connected with the high-concentration N type diffusion layer 220 through a contact opened in the first LDD oxide film 212. The first oxide film 214 is formed on the emitter leading-out electrode composed of the second conductive film 213. A side wall composed of the second LDD oxide film 216 is formed on the side wall of the emitter leading-out electrode composed of the second conductive film 213. The high-concentration P type diffusion layer 218 is formed to self-align with the side wall composed of the second LDD oxide film 216. The cobalt silicide film 221 is formed on the surface of the area 218.

The following will describe a process for fabricating a BiCMOS according to the second of the present invention, referring to FIGS. 14–20.

Figure 4:
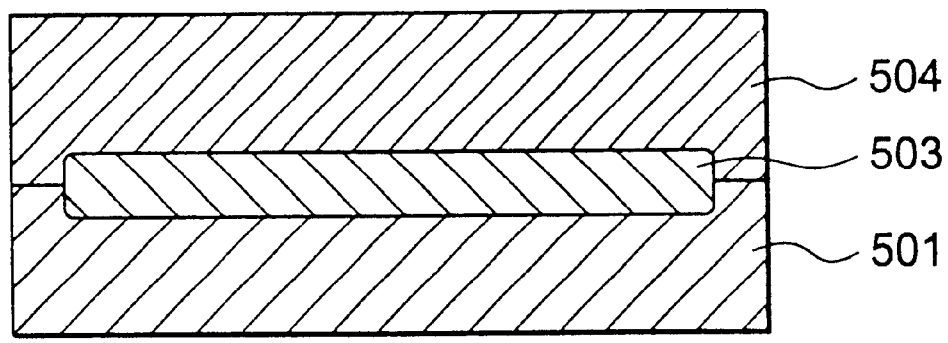
FIG. 4 is a sectional view showing a step of fabricating the bipolar transistor in the prior art.
Figure 5:
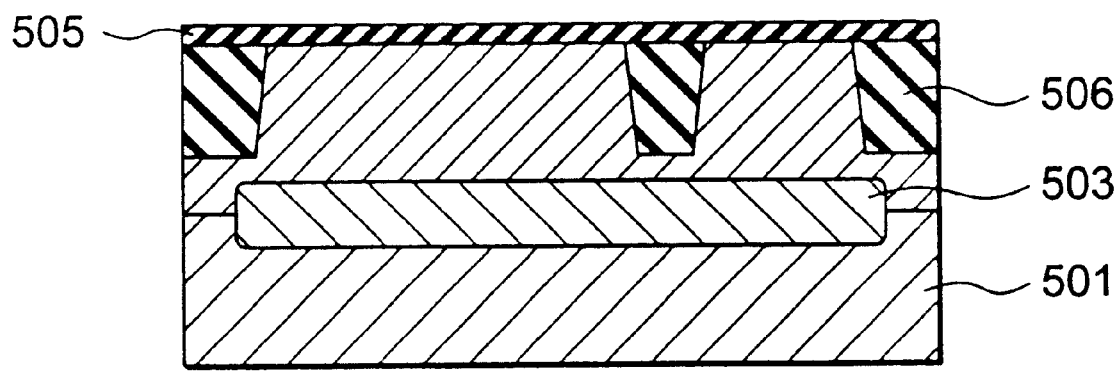
FIG. 5 is a sectional view showing a step next to the step shown in FIG. 4.
Figure 6:
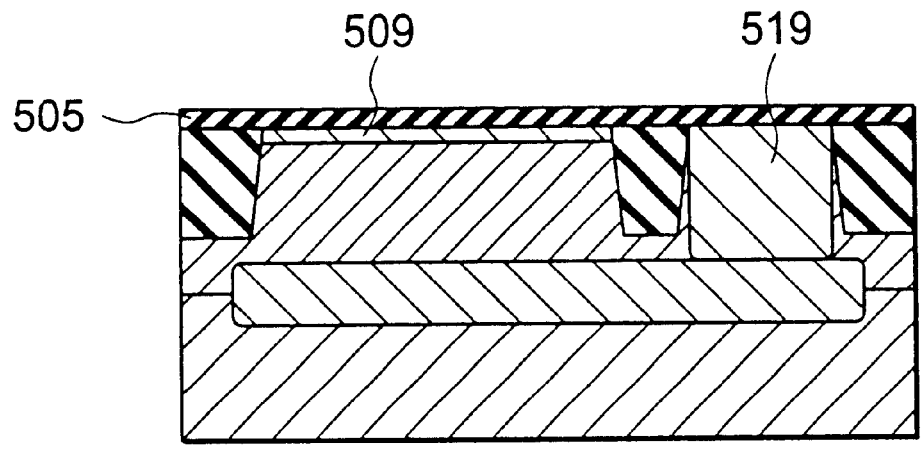
FIG. 6 is a sectional view showing a step next to the step shown in FIG. 5.
Figure 7:
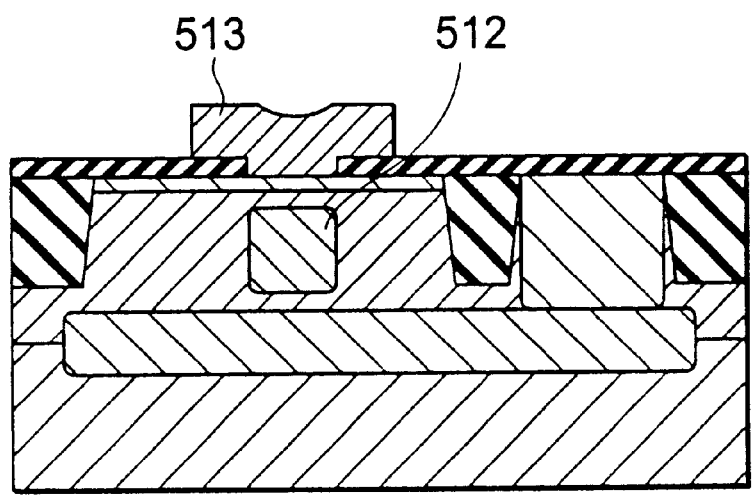
FIG. 7 is a sectional view showing a step next to the step shown in FIG. 6.
Figure 8:
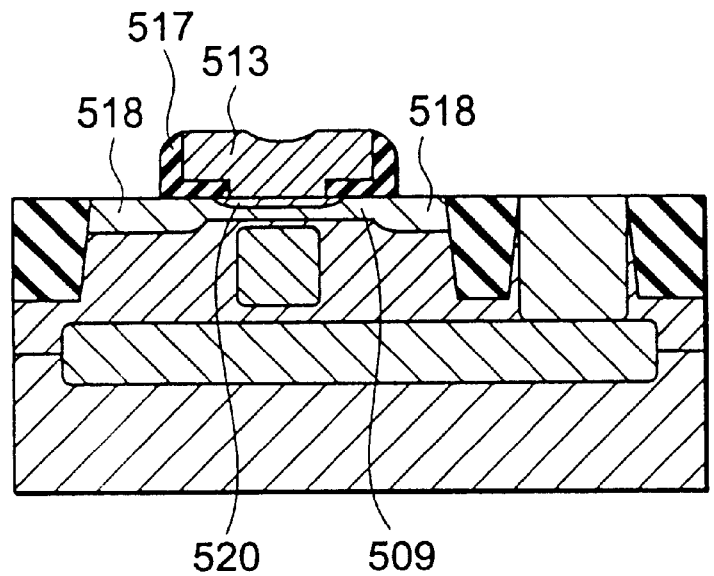
FIG. 8 is a sectional view showing a step next to the step shown in FIG. 7.

As shown in FIG. 4, the element isolation oxide film 202, the P type well area 204, and the first N type well area 203 are first formed on the P type semiconductor substrate 201.

Figure 15:
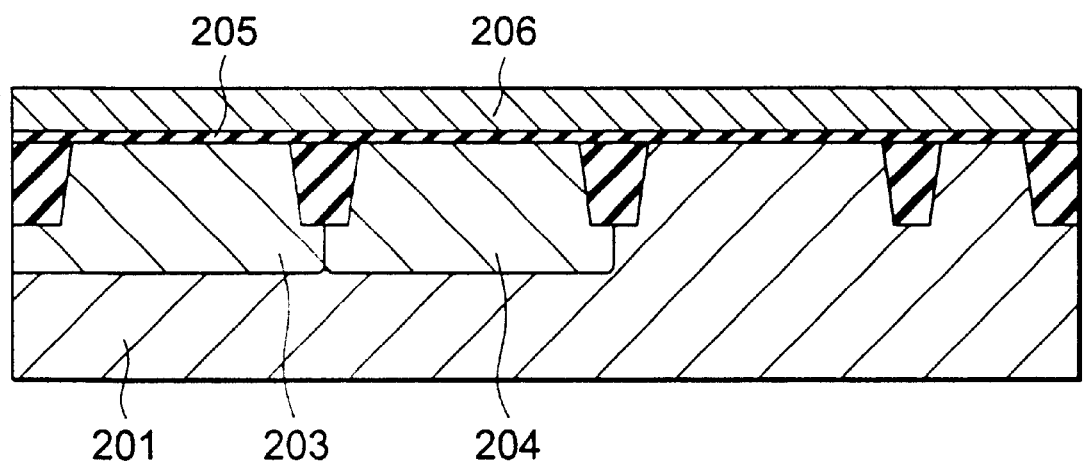
FIG. 15 is a sectional view showing a step next to the step shown in FIG. 14.

Next, as shown in FIG. 15, on the P type semiconductor substrate 201 are formed the gate oxide film 205 having a thickness of, for example, 2–4 nm and the first conductive film 206 having a thickness of, for example, 10–25 nm and comprising amorphous silicon, polycrystal silicon, amorphous silicon containing phosphorus, arsenic or boron, or the like.

Figure 16:
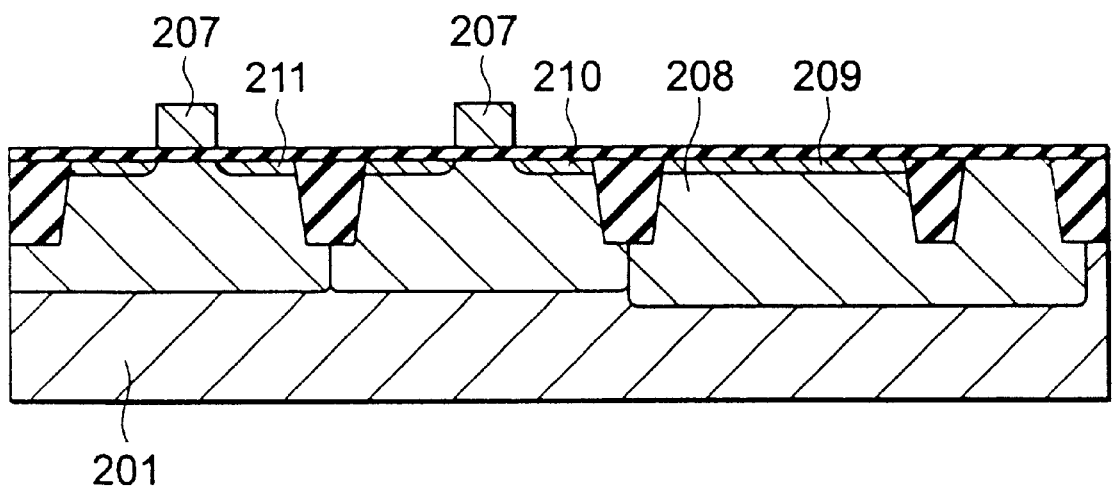
FIG. 16 is a sectional view showing a step next to the step shown in FIG. 15.

Next, as shown in FIG. 16, the first conductive film 206 is patterned to form the gate electrode 207. The N type diffusion layer 210 and the P type diffusion layer 211 are formed to self-align with the gate electrode. Phosphorus is implanted at an energy of 400–1000 keV to form the second N type well area 208. Moreover, boron or $BF_2$ is implanted at an energy of at most 4 keV or 15 keV, respectively, to form the intrinsic base region 209.

Figure 17:
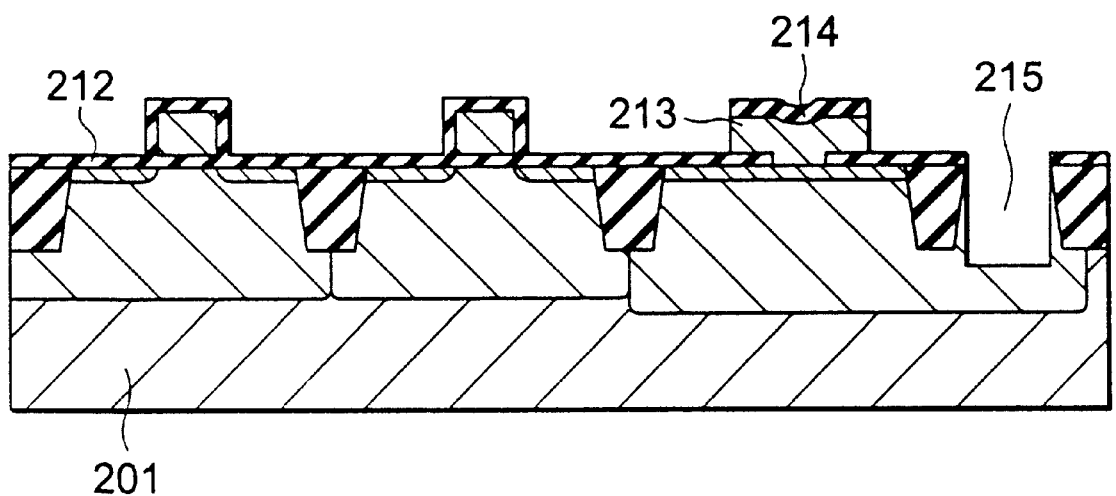
FIG. 17 is a sectional view showing a step next to the step shown in FIG. 16.

Next, as shown in FIG. 17, the first LDD oxide film 212 of, for example, 20–80 nm in thickness is grown, and then a window for the emitter is made. The second conductive film 213 having a thickness of, for example, 150–300 nm and comprising amorphous silicon, polycrystal silicon, amorphous silicon containing phosphorus or arsenic, or the like, and the first oxide film 214 having a thickness of, for example, 100–200 nm are grown. Photolithographic technique is used to form the emitter leading-out electrode. By over-etching at the time of patterning this emitter leading-out electrode, a trench collector 215 of, for example, 400–700 nm in depth is formed.

Next, as shown in FIG. 18, the second LDD oxide film 216 having a thickness of, for example, 40–100 nm is grown. This LDD oxide film 216 is subjected to anisotropic etching to form the side wall 217 composed of the first LDD oxide film 212 and the second LDD oxide film 216 on the side of the gate electrode 207 and form the side wall composed of the second LDD oxide film 216 on the sides of the second conductive film 213 and the trench collector 215. Ion implantation is performed to self-align with these side walls. In this way, the high-concentration P type diffusion layers area 218 and the high-concentration N type diffusion layer 219 are formed. The impurity contained in the second conductive film 213 is diffused by RTA so that the high-concentration N type diffusion layer 220 is formed.

Next, as shown in FIG. 19, cobalt is sputtered to form the cobalt film on the whole surface. Thereafter, the silicon layer on the surface of the semiconductor substrate is reacted with cobalt to form the cobalt silicide film 221. Subsequently, any unreacted cobalt film is removed by etching.

Next, as shown in FIG. 20, the interlayer dielectric 222 is formed to open the contact at a given position. The contact plug 223 comprising a barrier metal composed of W and, for example, Ti/TiN is then buried in the contact. A metal wiring 224 for connecting the contact plug 223 is formed on the interlayer dielectric 222.

Figure 21:
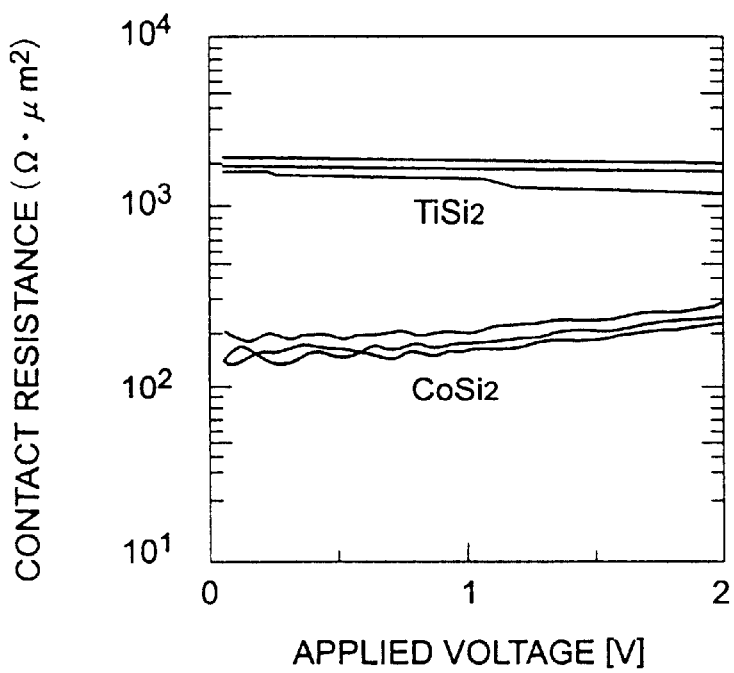
FIG. 21 is a graph showing comparison between a cobalt silicide film and a titanium silicide film about the relationship between applied voltage and contact resistance.

The following will describe the effect of the above-mentioned present invention. FIG. 21 is a graph showing contact resistance of a silicide film formed on the surface of the high-concentration P type diffusion layer, in which its horizontal axis represents applied voltage and its vertical axis represents contact resistance at the time of sending an electrical current in a so-called vertical direction. This graph shows dependency of the contact resistance upon the applied voltage in the case of forming a titanium silicide film and a cobalt silicide film as silicide films. The electric current sent in the vertical direction means an electric current that has run from the high-concentration P type diffusion layer to the silicide film in the thickness direction thereof and then run the contact plug contacting the silicide film. The contact resistance is a contact resistance between the silicide film and the high-concentration P type diffusion layer.

Figure 22:
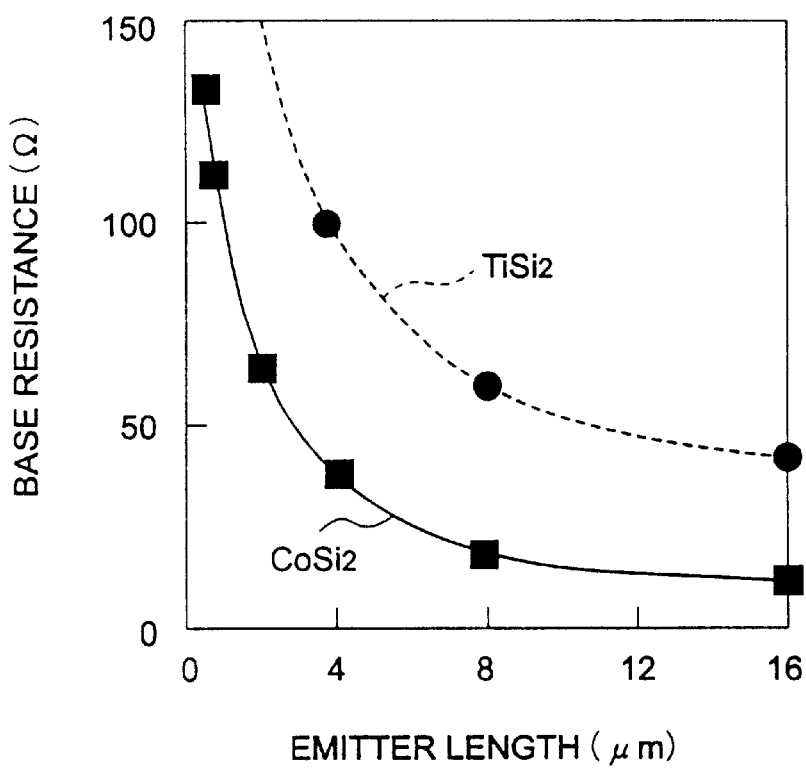
FIG. 22 is a graph showing comparison between a cobalt silicide film and a titanium silicide film about the relationship between emitter length and base resistance.
Figure 23:
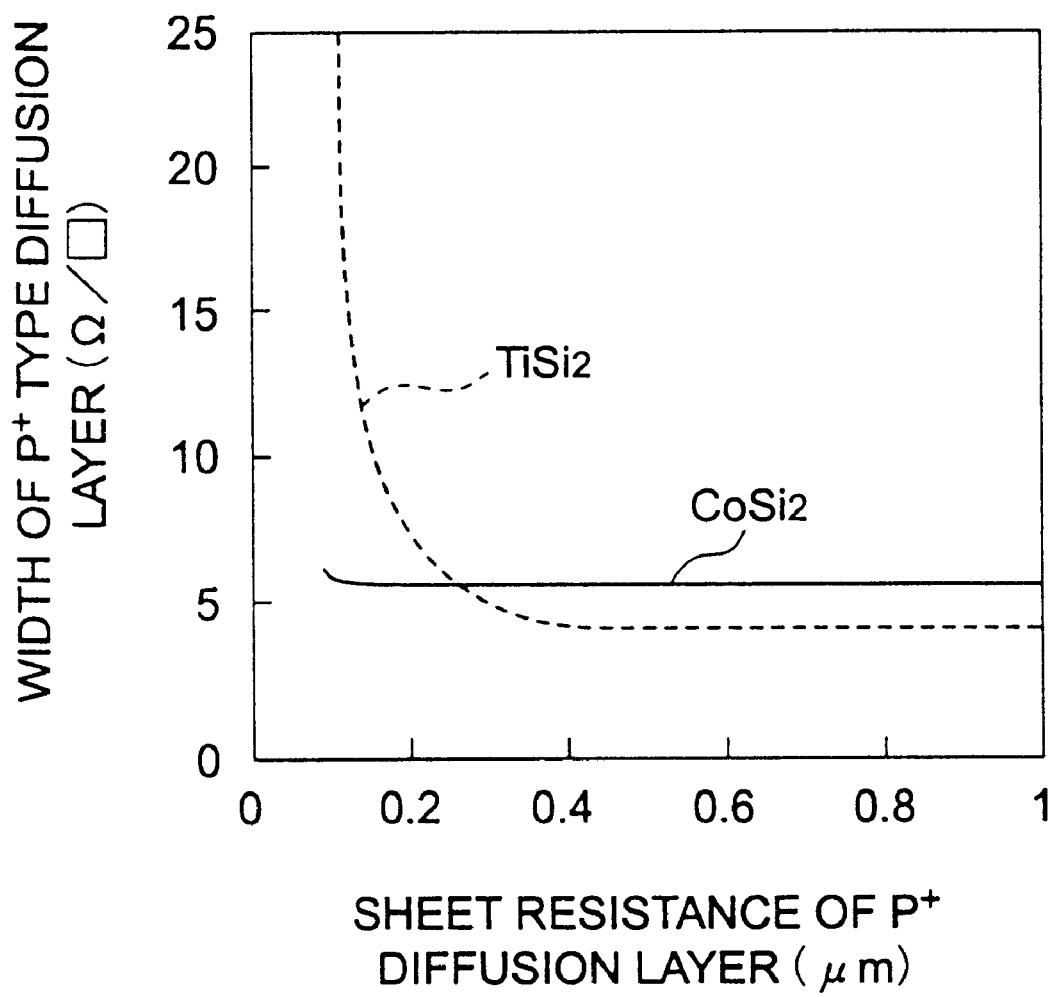
FIG. 23 is a graph showing comparison between a cobalt silicide film and a titanium silicide film about the relationship between the width of a diffusion layer and sheet resistance.

FIG. 22 is a graph showing the dependency of base resistance upon emitter length in the case of forming the titanium silicide film or the cobalt silicide, in which its horizontal axis represents the emitter length and the vertical axis represents the base resistance. As shown in FIGS. 21–23, this graph shows the dependency of base resistance upon emitter length in the bipolar transistor having a plan view layout wherein the base contact 125 is arranged at one side of the emitter electrode 113 composed of the second conductive film.

As shown in FIG. 21, in the case of using the cobalt silicide film instead of the titanium silicide film in the prior art, the contact resistance on the high-concentration P type diffusion layer is made smaller by about one figure. In this case, therefore, the base resistance can be made smaller than in the case of using the titanium silicide film. As shown in FIG. 22, in the case of the cobalt silicide film the base resistance can be reduced to about half of the base resistance in the case of the titanium silicide in the prior art.

FIG. 23 is a graph showing the affect on the relationship between the width of a $P^+$ type diffusion layer and the sheet resistance thereof by a cobalt silicide film and a titanium silicide film, wherein its horizontal axis represents the width and its vertical axis represents the sheet resistance. That is, this graph shows the dependency of sheet resistance upon the width of the diffusion layer in the case of forming a titanium silicide film and a cobalt silicide film on the surface of the high-concentration P type diffusion layer.

As shown in FIG. 23, when the width of the diffusion layer is wide (0.3 $\mu$m or more), the sheet resistance in the case of using the cobalt silicide film of the present invention is slightly higher than that in the case of using the titanium silicide film in the prior art: the sheet resistance of the former is about 6 $\Omega$/square and that of the latter is about 5 $\Omega$/square. In the case of the titanium silicide film, however, its sheet resistance does not rise even within the range in which the width of the diffusion layer is smaller than 0.3 $\mu$m. In other words, the sheet resistance of the titanium silicide film rises sharply in the range in which the width of the diffusion layer is smaller than 0.3 $\mu$m while the sheet resistance of the cobalt silicide film hardly rises and keeps low values in the same range. Therefore, in the present invention using the cobalt silicide film, which is different from the case using the titanium silicide film, the width of the diffusion layer can be made smaller without any rise in the sheet resistance. Moreover, the collector-base capacity Ccb can be reduced by using a plan view layout wherein the base contact 125 is made at one side of the polysilicon emitter electrode 113 shown in FIGS. 11–13.

Figure 1:
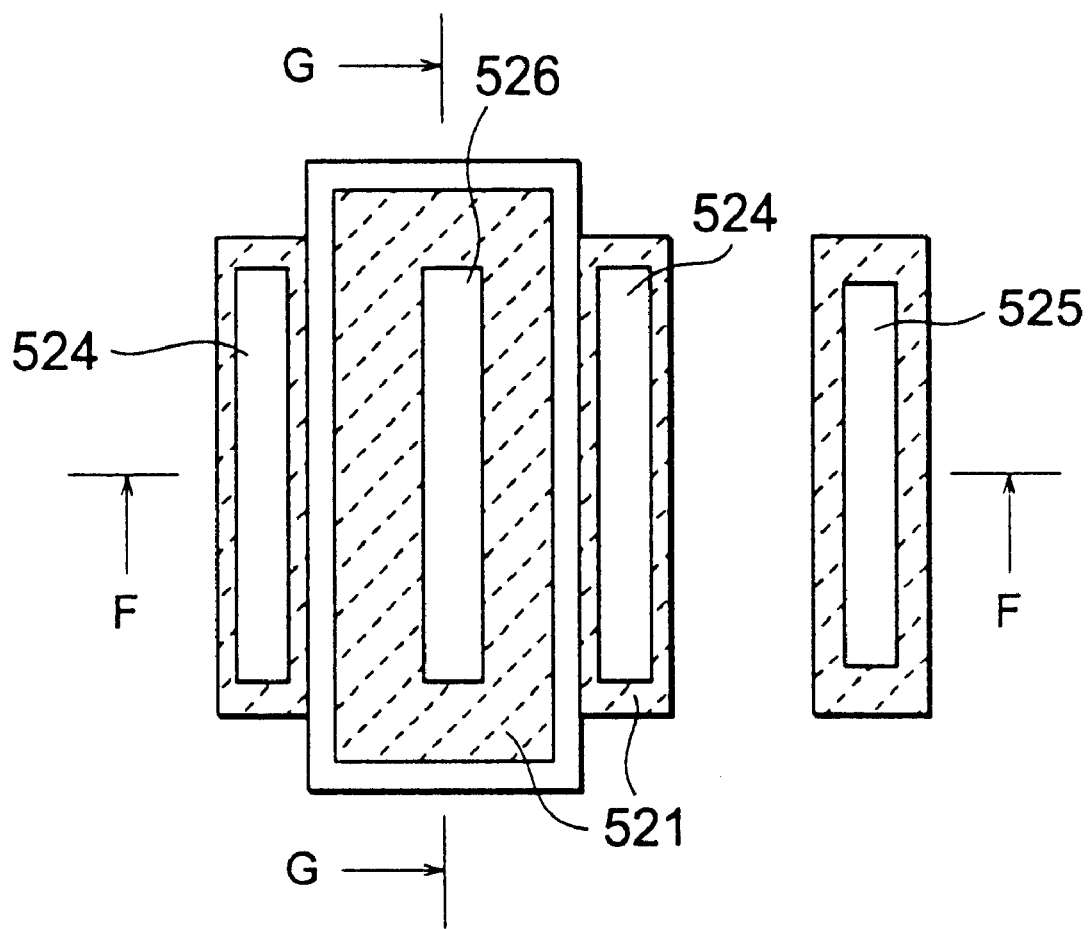
FIG. 1 is a plan view showing an arrangement of a bipolar transistor in the prior art.
Figure 2:
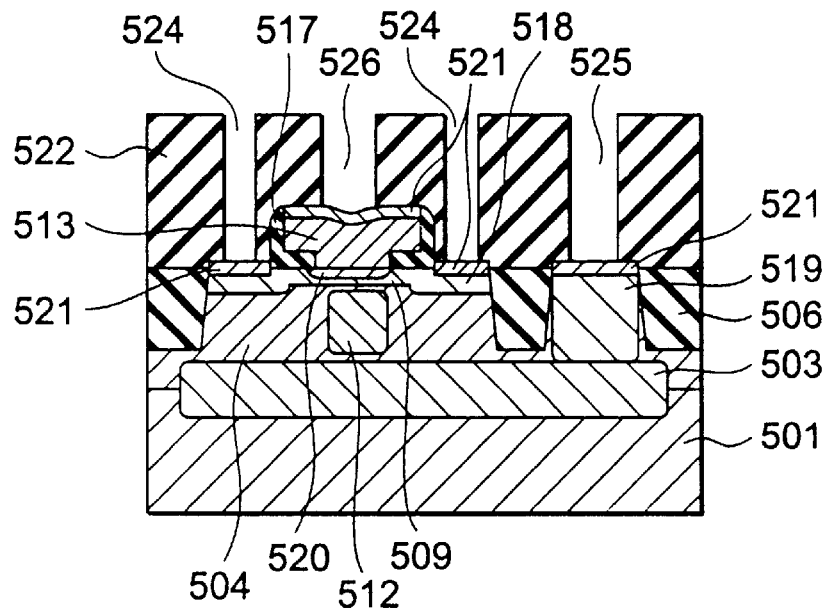
FIG. 2 is a sectional view taken along F—F line of FIG. 1.
Figure 3:
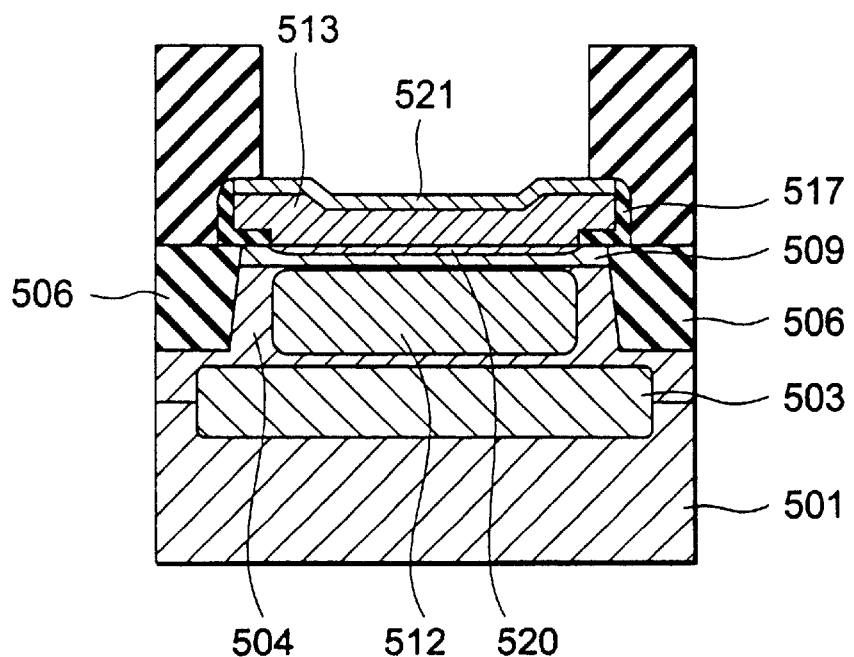
FIG. 3 is a sectional view taken along G—G line of FIG. 2.
Figure 24A:
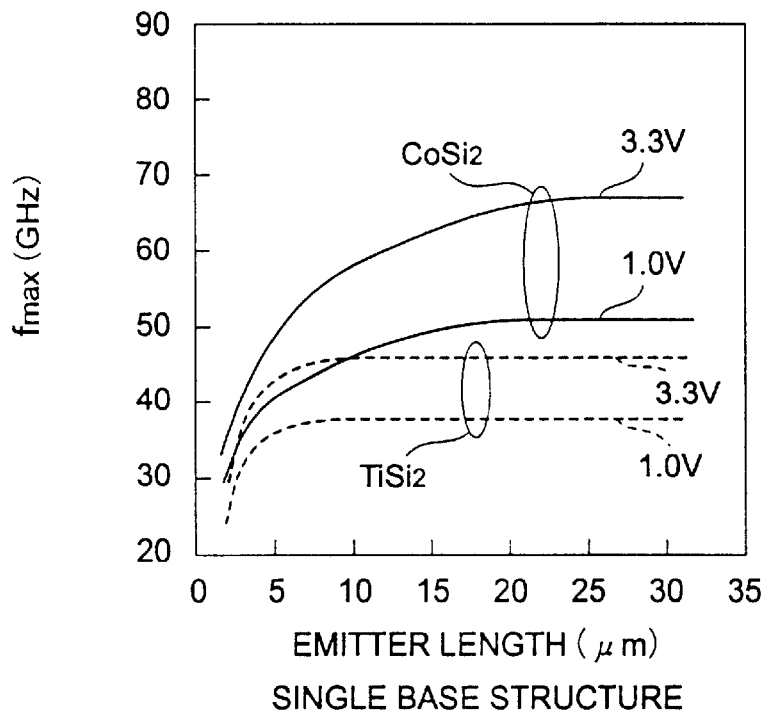
FIG. 24A is a graph showing comparison between a cobalt silicide film and a titanium silicide film about the relationship between emitter length and fmax when CE voltage is changed in a single base structure.
Figure 24B:
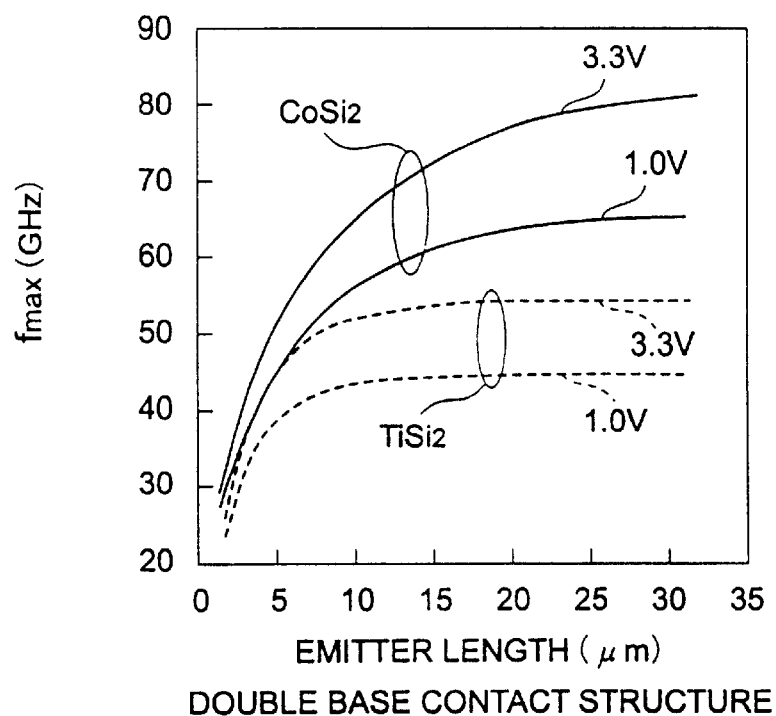
FIG. 24B is a graph showing comparison between a cobalt silicide film and a titanium silicide film about the relationship between emitter length and fmax when CE voltage is changed in a double base structure.

On the other hand, FIG. 24A shows the dependency of fmax of a bipolar transistor upon emitter length, the transistor having a plan view layout wherein the base contact 125 is made at one side of the polysilicon emitter electrode 113 shown in FIGS. 11–13 in the case wherein the titanium silicide film or the cobalt silicide film is formed on the surface of the high-concentration P type diffusion layer (this layout is referred to as a single base structure, hereinafter). FIG. 24B shows the dependency of fmax of a conventional bipolar transistor upon emitter length, the transistor having a plan view layout wherein the base contacts 525 are made at both sides of the emitter electrode 513 comprising the second conductive film and shown in FIGS. 1–3 in the case wherein the titanium silicide film or the cobalt silicide film is formed on the surface of the high-concentration P type diffusion layer (this layout is referred to as a double base structure, hereinafter).

By using the plan view layouts shown in FIGS. 11–13 related to the present invention together with the cobalt silicide film in the above-mentioned way, the collector-base capacity Ccb and the base resistance Rb can be simultaneously reduced. The inventor performed experiments, using the layout shown in the plan views related to the present invention. When the layout shown in FIGS. 11–13 was used, fmax was 46 GHz (the collector-emitter voltage: 3.3 V) at the time of using the titanium silicide film. However, fmax was 67 GHz (the collector-emitter voltage: 3.3 V) at the time of using the cobalt silicide film. Namely, fmax was able to be raised by about 1.45 times, as shown in FIG. 24A. When the plan view layout of the conventional structure shown in FIGS. 1–3, the base resistance can be reduced as shown in FIG. 24B. Therefore, when the titanium silicide film was used in this case, fmax was 54 GHz (the collector-emitter voltage: 3.3 V). However, when the cobalt silicide film was used, fmax was 80 GHz (the collector-emitter voltage: 3.3 V). Namely, fmax was able to be raised by about 1.48 times.

Figure 25:
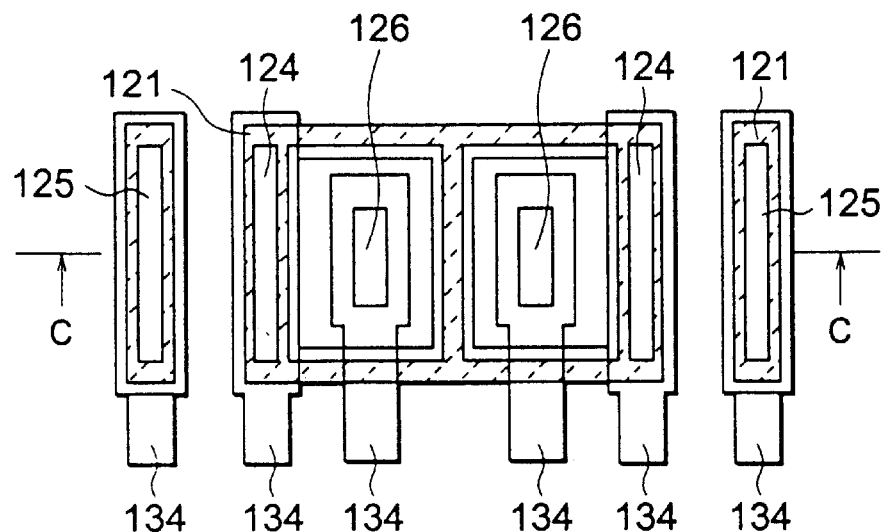
FIG. 25 is a plan view showing an arrangement of a bipolar transistor according to a third embodiment of the present invention.
Figure 26:
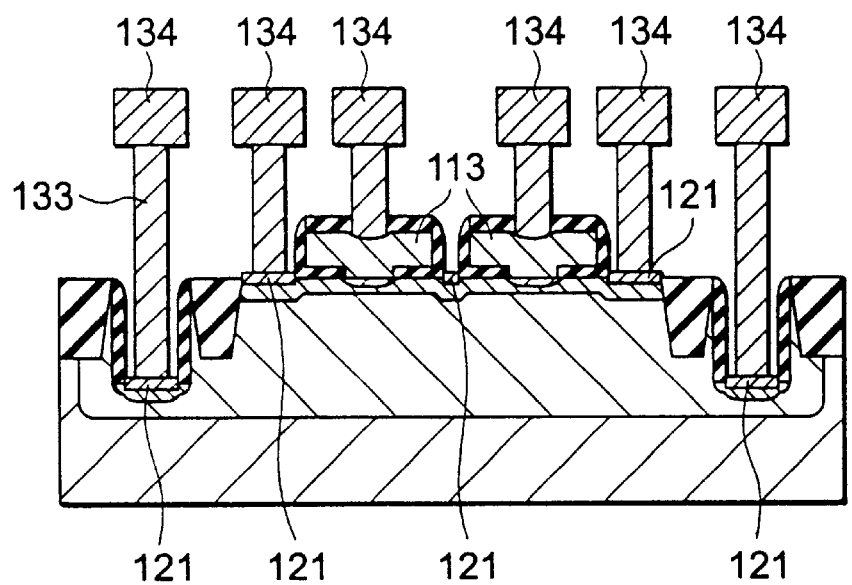
FIG. 26 is a sectional view taken along C—C line of FIG. 25.

The following will describe a third embodiment, referring to FIG. 25, and FIG. 26 taken along C—C line thereof. In many cases, basic blocks of a bipolar transistor generally used in an analogue circuit have a plurality of metal leading-out wirings for its emitter, base and collector in order to improve factors having an influence on its analogue characteristics, for example, its base resistance and high frequency noise (Nf).

Figure 9:
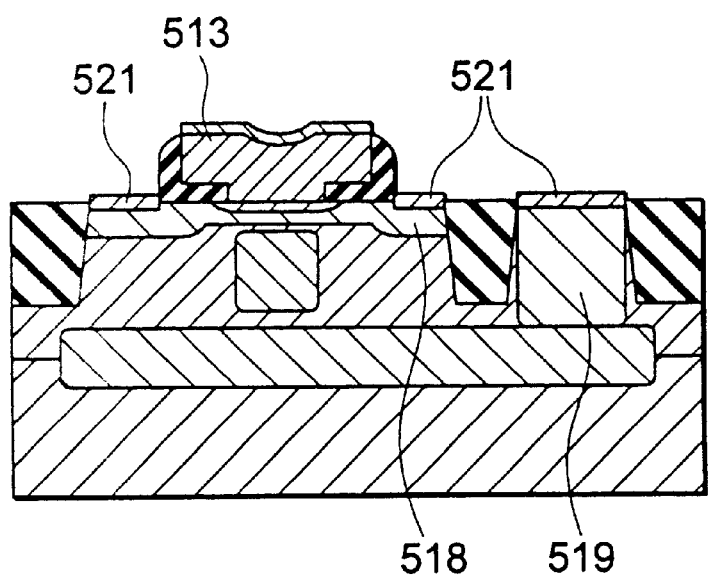
FIG. 9 is a sectional view showing a step next to the step shown in FIG. 8.
Figure 10:
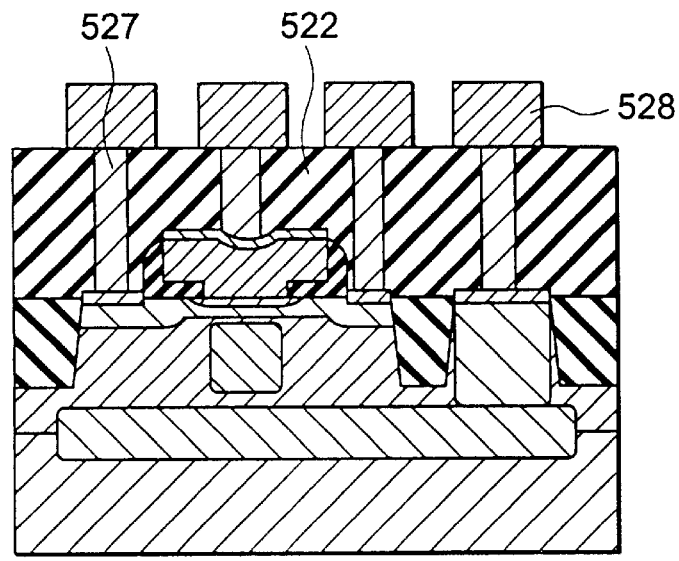
FIG. 10 is a sectional view showing a step next to the step shown in FIG. 9.

In order to realize this in the prior art, 7 wirings and 7 contacts are necessary as shown in FIG. 9 and FIG. 10, which is a sectional view taken along E—E line thereof. In FIGS. 9 and 10, a plan view layout in the prior art has contacts for the following from the left side: a collector/a base/an emitter/a base/an emitter/a base/a collector. In FIG. 10, reference numbers 534 and 533 represent wirings for the collector, the base and the emitter, and contact plugs connecting to the wiring 534. The contact plugs are buried in a non-illustrated interlayer dielectric.

On the other hand, in a bipolar transistor (shown in FIG. 25) of the third embodiment in the present invention, its base resistance Rb can be reduced by using a cobalt silicide film. Therefore, it is sufficient that a pair of base contacts are disposed for a pair of emitter electrodes 113. As a result, its plan view layout can be made into a layout having six contacts for a collector/a base/an emitter/an emitter/a base/a collector. By this plan view layout, one metal wiring for extrinsic base can be cut down, as compared with the prior art. Therefore, the collector-base capacity Ccb can be reduced. This makes it possible to improve the maximum oscillation frequency fmax still more. In FIG. 26, reference numbers 134 and 113 represent wirings for the collector, the base and the emitter, and contact plugs connecting with the wiring 134, respectively. The contact plugs are buried in a non-illustrated interlayer dielectric.

Figure 27:
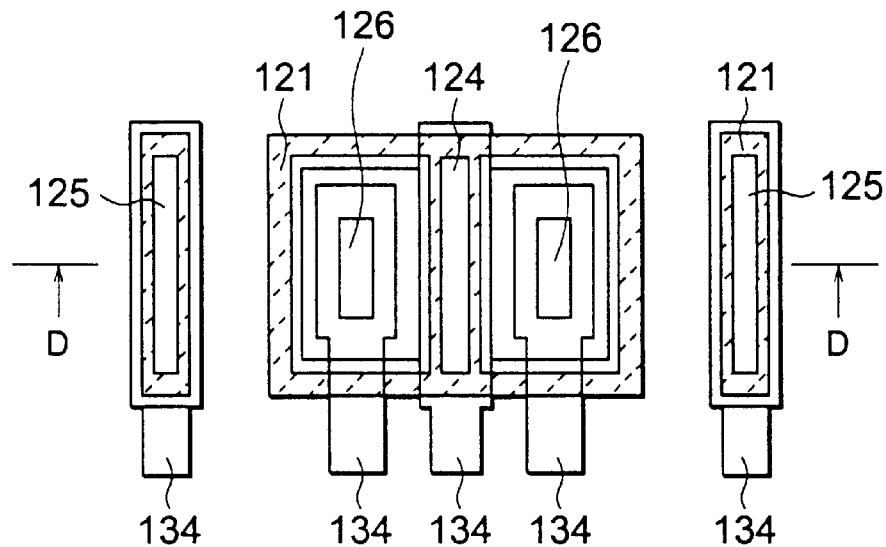
FIG. 27 is a plan view showing an arrangement of a bipolar transistor according to a fourth embodiment of the present invention.
Figure 28:
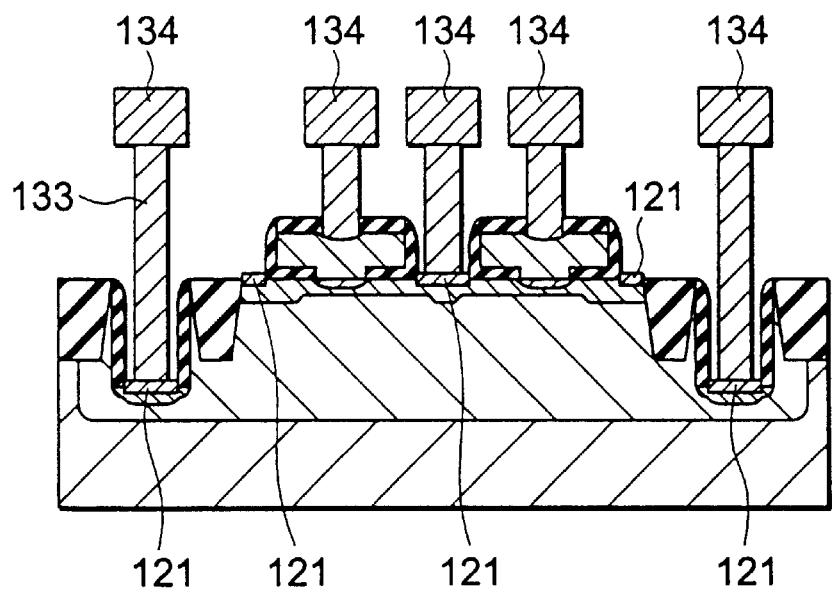
FIG. 28 is a sectional view taken along D—D line of FIG. 27.
Figure 29:
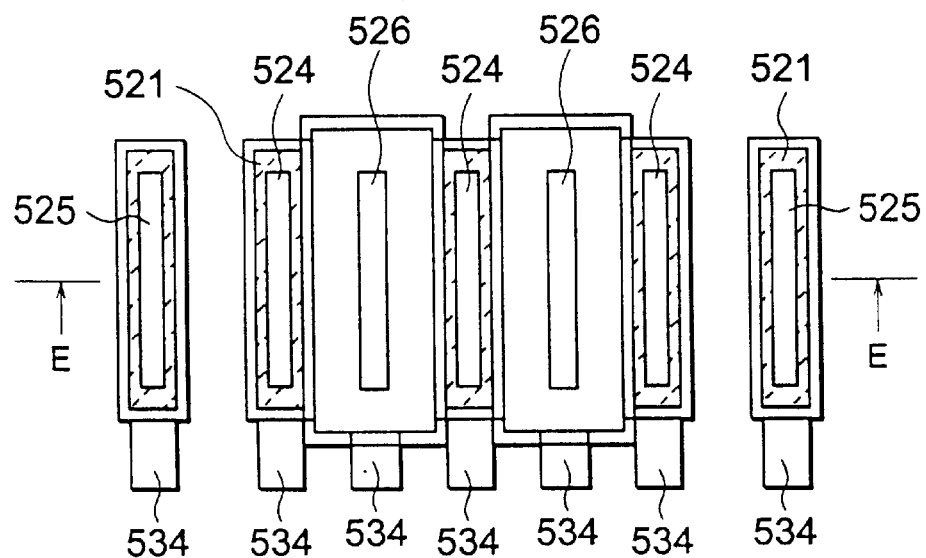
FIG. 29 is a plan view showing an arrangement of a bipolar transistor in the prior art.
Figure 30:
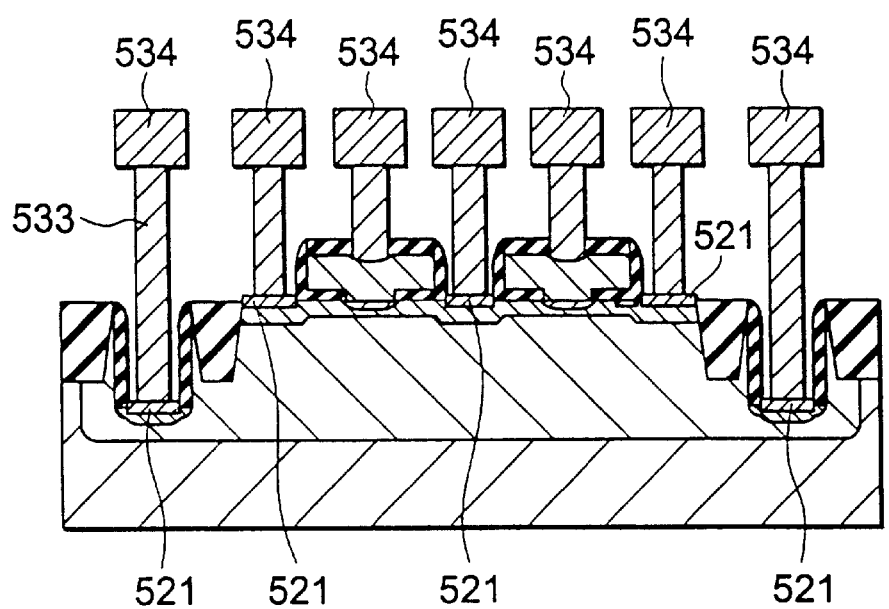
FIG. 30 is a sectional view taken along E—E line of FIG. 29.

FIG. 27 is a plan view showing a layout of respective layers of a bipolar transistor according to a fourth embodiment. FIG. 28 is a sectional view taken along D—D line of FIG. 27. The embodiment shown in FIGS. 27 and 28 has a plan view layout comprising five contacts for a collector/an emitter/a base/an emitter/a collector. Therefore, one metal wiring for extrinsic base can be cut, as compared with the third embodiment shown in FIGS. 25 and 26, so that the collector-base capacity Ccb can be reduced still more. For this reason, the product of the base resistance Rb and the collector-base capacity Ccb can be reduced so that the maximum oscillation frequency fmax can be improved still more.

As described above, according to the present invention, a cobalt silicide film for extrinsic base is formed to surround an emitter electrode, as viewed from above. Therefore, both the base resistance Rb and the collector-base capacity Ccb can be reduced to improve the maximum oscillation frequency fmax. This makes it possible to improve the transistor characteristics remarkably.

What is claimed is:

1. A semiconductor device, comprising:
   a first conduction type semiconductor substrate;
   a second conduction type area formed on a surface of the semiconductor substrate;
   a first conduction type intrinsic base region formed on a surface of the second conduction type area;
   an extrinsic base region surrounding the intrinsic base region;
   a second conduction type emitter region formed in the intrinsic base region;
   an emitter electrode contacting the emitter region;
   a base electrode contacting the extrinsic base region on only one side of the emitter electrode;
   a second conduction type collector plug region formed in the second conduction type area;
   an element isolation area for isolating the first conduction type intrinsic base region and the extrinsic base region electrically from the second conduction type collector plug region; and
   a cobalt silicide film formed to surround the emitter electrode, as viewed from above, on the extrinsic base region, and formed to contact a surface of the second conduction type collector plug region.

2. A semiconductor device, comprising:
   a first conduction type semiconductor substrate;
   a second conduction type buried layer formed in the semiconductor substrate;
   a second conduction type epitaxial layer formed on the buried layer;
   a first conduction intrinsic base region formed on a surface of the epitaxial layer;
   an extrinsic base region surrounding the intrinsic base region;
   a second conduction type emitter region formed in the intrinsic base region;
   an emitter electrode contacting the emitter region;
   a base electrode contacting the extrinsic base region on only one side of the emitter electrode;
   a second conduction type collector plug region formed on the buried layer;
   an element isolation area for isolating the intrinsic base region and the extrinsic base region electrically from the conductor plug region; and
   a cobalt silicide film formed to surround the emitter electrode, as viewed from above, on the extrinsic base region, and formed to contact a surface of the second conduction type collector plug region.

3. The semiconductor device according to claim 1, wherein at least one base contact connected with the extrinsic base region contacts the single emitter electrode.

4. The semiconductor device according to claim 1, which further comprises a cobalt silicide film formed on the emitter electrode region.

5. The semiconductor device according to claim 1, wherein the extrinsic base region is formed to surround the emitter electrode, as viewed from above.

6. The semiconductor device according to claim 1, which further comprises an interlayer dielectric formed on the whole surface, contact holes formed on respective parts of the emitter electrode, the extrinsic base region and the collector plug region in the interlayer dielectric, metal plugs buried in the contact holes, and a wiring layer formed on the interlayer dielectric and connected with the plugs.

7. The semiconductor device according to claim 6, wherein the emitter electrode comprises polysilicon and the plugs comprise tungsten.

8. The semiconductor device according to claim 2, wherein the epitaxial layer has therein a second conduction type pedestal collector having an impurity concentration that is in the middle of those of the buried layer and the epitaxial layer.

9. A semiconductor device, comprising:
   a first conduction type semiconductor substrate;
   a second conduction type first and second well areas formed on a surface of the semiconductor substrate;
   a first conduction type third well area formed on the surface of the semiconductor substrate between the first and second well areas;
   a first conduction type MOS transistor formed in the first well area;
   a second conduction type MOS transistor formed on the third well area; and
   a bipolar transistor formed in the second well area, said bipolar transistor comprising
   a first conduction type intrinsic base region formed on the surface of the second well area,
   an extrinsic base region surrounding the intrinsic base region,
   a base electrode contacting the extrinsic base region on only one side of the emitter electrode;
   a second conduction type emitter region formed in the intrinsic base region,
   an emitter electrode contacting the emitter region, a second conduction type collector plug region formed in the second conduction type second well area,
   an element isolation area for isolating the first conduction type intrinsic base region and the extrinsic base region electrically from the second conduction type collector plug region, and
   a cobalt silicide film formed to surround the emitter electrode, as viewed from above, on the extrinsic base region, and formed to contact a surface of the second conduction type collector plug region.

10. The semiconductor device according to claim 9, wherein at least one base contact connected with the extrinsic base region contacts the single emitter electrode.

11. The semiconductor device according to claim 9, wherein the collector plug region is a diffusion layer formed at the bottom of a trench formed in the second well area.

12. A semiconductor device, comprising:

a first conduction type semiconductor substrate;

a second conduction type area formed on a surface of the semiconductor substrate;

a pair of first conduction type intrinsic base regions formed on a surface of the second conduction type area;

a first conduction type extrinsic base region formed to surround the intrinsic base regions as viewed from above;

a second conduction type emitter region formed in the respective intrinsic base regions;

a pair of emitter electrodes contacting the emitter region;

at most two base electrodes contacting the extrinsic base region, each base electrode contacting the extrinsic base region on only one side of an emitter electrode;

a collector plug region formed in the second conduction type area;

an element isolation area for isolating the extrinsic base region electrically from the collector plug region; and a cobalt silicide film formed to surround the respective emitter electrodes, as viewed from above, on the extrinsic base region, and formed to contact a surface of the collector plug region.

13. The semiconductor device according to claim 12, which further comprises a pair base contacts connected with the extrinsic base region arranged in the extrinsic base regions at both outsides of the emitter electrodes.

14. The semiconductor device according to claim 12, which further comprises a base contact connected with the extrinsic base region arranged in the extrinsic base region between the pair of the emitter electrodes.

15. The semiconductor device according to claim 12, wherein the collector plug region is a diffusion layer formed at the bottom of a trench formed in the second conduction type area.

* * * * *